United States Patent [19]

Canty et al.

[11] Patent Number: 5,057,371
[45] Date of Patent: Oct. 15, 1991

[54] AZIRIDINE-TREATED ARTICLES

[75] Inventors: George Canty, Woodbury; Robert E. Jones, Minneapolis, both of Minn.

[73] Assignee: Minnesota Mining and Manufacturing Company, St. Paul, Minn.

[21] Appl. No.: 745,261

[22] Filed: Jun. 14, 1985

[51] Int. Cl.$^5$ .............................................. B32B 33/00
[52] U.S. Cl. ................... 428/411.1; 428/426; 428/457; 428/704
[58] Field of Search ............... 528/424; 428/694, 900, 428/426, 446, 457, 411.1, 409, 704, 480, 522, 523, 447, 477.7, 474.4, 473.5, 532, 412; 427/301, 322

[56] References Cited

U.S. PATENT DOCUMENTS

| | | | |
|---|---|---|---|
| 2,889,289 | 6/1959 | Reeves | 528/244 |
| 3,017,280 | 1/1962 | Tudelson | 106/125 |
| 3,206,328 | 9/1965 | Shaw | 428/395 |
| 3,386,880 | 6/1968 | Lomas | 528/424 |
| 3,471,359 | 10/1969 | Goldstein | 528/424 |
| 3,542,502 | 11/1970 | Tesoro | 427/301 |
| 4,167,414 | 9/1979 | Morgan | 96/87 R |
| 4,181,528 | 1/1980 | Work, III | 428/474 |
| 4,241,169 | 12/1980 | Work, III | 430/532 |
| 4,263,188 | 4/1981 | Hampton | 232/62.54 |
| 4,418,164 | 11/1983 | Logullo | 428/395 |
| 4,490,505 | 12/1984 | Pendergrass | 428/900 |

FOREIGN PATENT DOCUMENTS

| | | |
|---|---|---|
| 39082 | 10/1976 | Japan ............... 427/128 |
| 128304 | 10/1979 | Japan . |

*Primary Examiner*—Paul J. Thibodeau
*Attorney, Agent, or Firm*—Gary L. Griswold; Walter N. Kirn; Steven E. Skolnick

[57] ABSTRACT

An article having an aziridine-modified surface is provided. Functional layers may be applied to the modified surface. Such layers exhibit good adhesion to the article.

2 Claims, No Drawings

AZIRIDINE-TREATED ARTICLES

TECHNICAL FIELD

The present invention concerns the treatment of organic and inorganic surfaces. More specifically it concerns articles which have a surface that has been treated so as to improve the adhesion of various subsequently applied materials.

BACKGROUND ART

Many techniques have been employed to treat surfaces for the purpose of improving the adhesion of various subsequently applied materials. Such techniques include subjecting surfaces to high energy (e.g., corona discharge, electron beam discharge, flame treatment and the like) and chemically modifying surfaces by chemical etching and the like. Such techniques require the use of expensive equipment and may expose the operator to high energy radiation or dangerous chemicals.

Parachlorophenol has been used as a surface treatment. This material provides only minimal improvement in adhesion compared to the present invention and suffers from the major disadvantage that it is hazardous to human health.

Surfaces have also been coated with primers in an effort to enhance the adhesion of subsequently applied coatings. Primers frequently must be cured after application. This adds time and expense to the manufacturing process. Additionally, the substrate often must be treated in some way (e.g., subjected to high energy) in order that the primer will exhibit sufficient adhesion to it. Primers are also frequently compounded to meet the needs of a specific coating or class of such coatings. For these and other reasons, the use of primers has not proven entirely satisfactory.

Yet another approach is to incorporate aziridine-containing materials into functional coatings which contain groups reactive with the aziridine functionality. These coatings are then applied to a substrate. See, for example, U.S. Pat. Nos. 3,017,280; 4,167,414; 4,181,528; and 4,241,169.

These references disclose that the substrate and the functional coatings must each contain groups reactive with the aziridine group so that the aziridine essentially acts as a tie layer to better anchor the functional coatings to the substrate through crosslinking reactions. They also generally disclose that substrates which do not inherently contain the requisite surface functionality to react with the aziridine (i.e., inert materials) must undergo prior modification by oxidative treatment to incorporate that functionality. Such substrates include, for example, conventional polyesters such as poly(ethylene terephthalate), conventional polyolefin films such as polyethylene, polypropylene and polystyrene.

U.S. Pat. No. 4,418,164 discloses coating aramid filaments with polyfunctional aziridines. The coated filaments are used as reinforcing fibers in unsaturated polyester matrices wherein they are totally encased in the matrices.

DISCLOSURE OF THE INVENTION

The present invention is directed to articles having at least one essentially flat surface which has been treated with a composition consisting essentially of a compound having at least one aziridine functionality. The treatment renders the surface more adherent to subsequently applied layers. The present invention is also directed to processes for modifying such surfaces.

It has been found that the adhesion of a variety of functional coatings to a surface can be improved if, prior to applying the coating, the surface is first treated with an aziridine-containing compound. Surprisingly this improvement is achieved on a wide variety of inorganic and organic surfaces including metals, glass, ceramics and polymers. These surfaces include normally inert materials such as the polyesters and polyolefins discussed above. Even more surprising is the fact that the improvement is achieved even though the surface has not undergone oxidative treatment.

The articles of the invention have the highly desirable characteristic that a variety of subsequently applied functional materials adhere well to the modified surface. Such functional materials include magnetic recording medium (e.g., particulate materials in a binder), gelatin and other layers used in photographic film, adhesive coatings (e.g., pressure sensitive, heat activated, solvent activated, etc.), radiation sensitive compositions (e.g., diazo systems, photo-reactive polymers, etc.) silane coatings, etc.

The articles of the invention can comprise any flexible or rigid substrate having at least one essentially flat surface. Included in this definition are sheet-like articles such as tapes, ribbons, films, discs, and the like. Sheet-like materials may have opposed parallel surfaces and are generally substantially thinner than they are either wide or long. However, also included in this definition are articles which are substantially thicker and which need not have opposed parallel surfaces.

The articles of the invention demonstrate excellent room temperature shelf stability as there is no measurable reduction in their ability to anchor subsequently applied coatings even though the articles have been stored for extended periods of time.

DETAILED DESCRIPTION

The aziridine-containing compounds useful in the invention include any compound containing at least one aziridine functionality, and preferably 2 or more aziridine functionalities.

The aziridine-containing compound may also contain other functional groups. Preferably these groups are not reactive with the aziridine functionality but are reactive with functional groups contained in the subsequently applied layer. Thus, for example, the aziridine-functional compound may also contain one or more hydroxyl groups. Such an aziridine-functional compound is particularly useful where the subsequently applied layer contains isocyanate groups.

The aziridine-functional compounds useful in the present invention may be represented by the formula

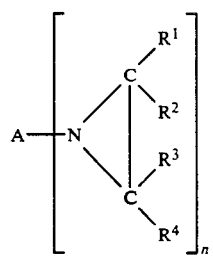

wherein A is an n valent organic or inorganic group, n is a whole number of at least one (preferably 2 to 4), and $R^1$, $R^2$, $R^3$ and $R^4$ may be the same or different and are individually selected from the group consisting of hydrogen and lower alkyl (branched or straight chain) groups containing from 1 to 8 (preferably from 1 to carbon atoms.

The nitrogen atom of the aziridine group is preferably linked to an atom having a valence of 4 or 5 (most preferably C or P). Preferably, $R^1$, $R^2$ and $R^3$ are each hydrogen and $R^4$ is selected from hydrogen and alkyl containing from 1 to 4 (most preferably 1 to 2) carbon atoms.

A may be an aliphatic, aromatic or alicyclic organic radical which may contain atoms such as oxygen, sulfur, nitrogen, etc. A may also be an inorganic radical, such as

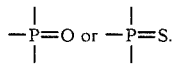

A preferably is

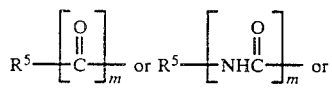

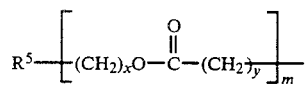

where $R^5$ is an m-valent aliphatic, aromatic or alicyclic radical which may contain atoms other than carbon, e.g., oxygen, nitrogen or sulfur, m is a whole number of at least 1, and x and y are individually 0, 1 or 2.

Specific examples of useful aziridine-containing materials include

A. "CX-100" available from Polyvinyl Chemical Industries and believed to have the formula

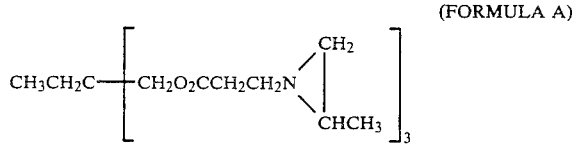

(FORMULA A)

(Trimethylol-tris[β-(N-methylaziridinyl)]-propionate)

B. "XAMA-7" available from Cordova Chemical Company and believed to be a mixture of

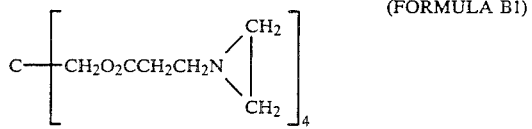

(FORMULA B1)

and

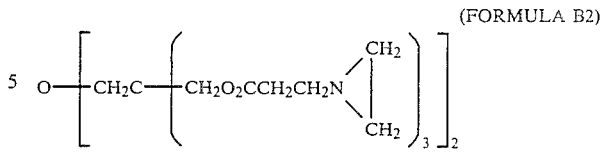

(FORMULA B2)

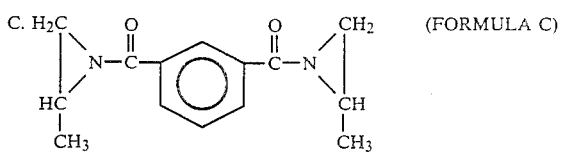

(FORMULA C)

(1,1'-(1,3-phenylenedicarbonyl)bis[2-methyl aziridine])

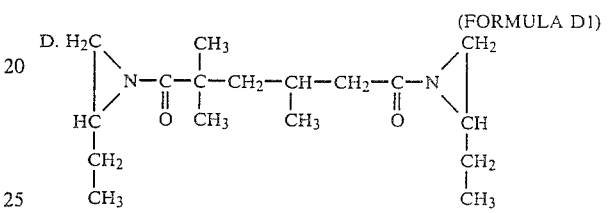

(FORMULA D1)

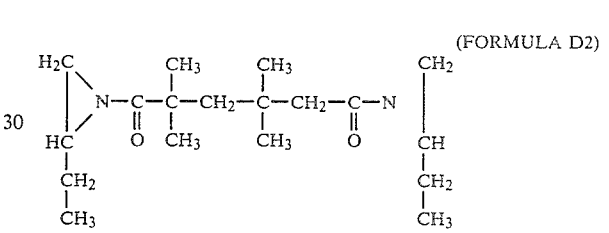

(FORMULA D2)

(1,1'-trimethyladipoyl bis[2-ethylaziridine])

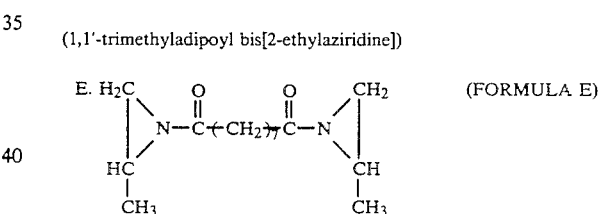

(FORMULA E)

(1,1'-azelaoyl bis[2-methyl aziridine])

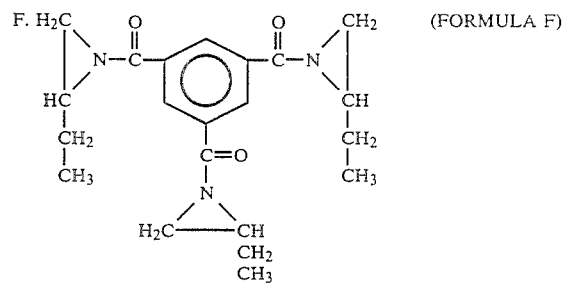

(FORMULA F)

(1,1',1''-(1,3,5-benzenetriyltricarbonyl)-tris[2-ethylaziridine])

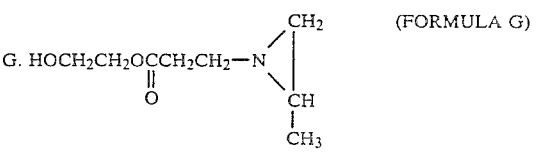

(FORMULA G)

(2-hydroxyethyl-3-(2-methyl aziridinyl)-propionate)

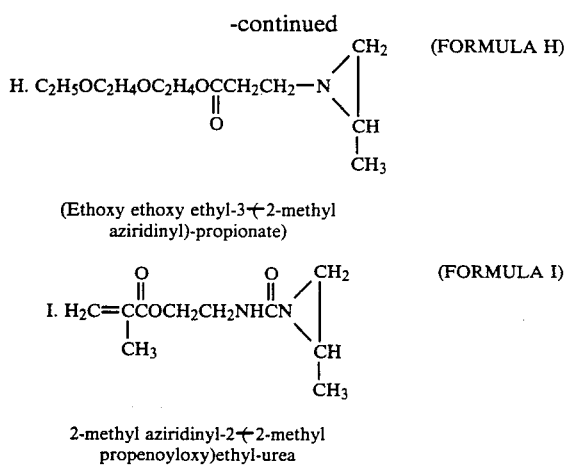

H. $C_2H_5OC_2H_4OC_2H_4OCCH_2CH_2-N\begin{smallmatrix}CH_2\\CH\\|\\CH_3\end{smallmatrix}$ (FORMULA H)

(Ethoxy ethoxy ethyl-3-(2-methyl aziridinyl)-propionate)

I. $H_2C=CCOCH_2CH_2NHCN\begin{smallmatrix}CH_2\\CH\\|\\CH_3\end{smallmatrix}$ (FORMULA I)

2-methyl aziridinyl-2-(2-methyl propenoyloxy)ethyl-urea

The amount of aziridine-containing material needed to provide the modified surface must be sufficient to permit interaction between the aziridine and the surface to be modified. The interaction may be the chemical reaction between the aziridine group(s) and functional groups present at the surface, mechanical interlocking between fissures or openings in the surface and the aziridine-containing material, or entrainment of the aziridine-containing group in the treated surface. Entrainment may occur by swelling of the surface due to contact with either a solvent or the aziridine-containing material followed by subsequent penetration of the aziridine-containing material into the surface to be treated. Combinations of these interactions may also occur.

As noted, both organic and inorganic surfaces can be modified in the practice of the invention. Examples of organic surfaces include polyesters (e.g., saturated and unsaturated, linear and branched) such as poly(ethylene terephthalate), poly(1,4-cyclohexylenedimethylene terephthalate), poly(ethylene naphthalate), polymers of maleic anhydride and ethylene glycol, polymers prepared from ethylenically unsaturated monomers such as polyethylene, polypropylene, polymethylmethacrylate, polyvinyl fluoride, polyvinylidene fluoride, polystyrene, polyvinyl chloride, polyvinyl acetate, polymethylmethacrylate, copolymers of ethylene and acrylic acid, copolymers of ethylene and vinyl acetate, polycarbonates such as the Lexan TM series of materials available from General Electric, polyimides such as the Kapton TM series of materials available from DuPont, polyamides such as the Dartek TM series of nylon materials available from DuPont, cellulose acetates, polydimethylsiloxanes and the like. Oriented and unoriented organic surfaces may be used in the practice of the invention.

Examples of useful inorganic surfaces include metals (such as aluminum, copper, etc.), glass and ceramic.

The layer provided by the aziridine treatment may be continuous, intermittent, smooth, rough, textured, etc. Moreover, it may vary in thickness if desired.

Normally, suitable adhesion promotion is achieved if the aziridine treatment provides a layer at least 0.005 microns ($\mu$) thick. Preferably this layer is from 0.01 to 5$\mu$ thick and most preferably from 0.02 to 0.5$\mu$ thick.

Treatment may be easily accomplished. For example, the surface to be treated is first preferably cleaned to remove dirt and grease. Known cleaning techniques may be used. The surface is then contacted with a composition containing an aziridine-containing compound using a variety of techniques such as brushing, spraying, roll coating, curtain coating, knife coating, etc., and then processed at a time for a temperature so as to cause interaction between the surface and the aziridine group(s).

A wide range of processing temperatures may be used to bring about the desired interaction. The particular temperature employed must be sufficient to permit interaction between the aziridine-containing compound and the substrate but not so high as to degrade either the surface being treated or the aziridine functionality. Typical processing temperatures range from 15 to 250° C. Preferably the treated surface is processed at a temperature of from 70 to 140° C.

The resulting coating comprises a thin dry, preferably solvent-resistant layer on the surface of the substrate. This layer is most preferably insoluble in common solvents for the substrate. Thus, for example, after being formed on a polyester surface, the layer cannot be dissolved in common solvents for polyester.

The treatment composition may comprise either the aziridine compound alone or, alternatively, a water or solvent solution or dispersion of the aziridine. Such liquid treatment compositions typically comprise from 0.01 to 15 (and preferably from 0.2 to 1) percent by weight of the aziridine. Examples of organic solvents useful in such compositions include acetone, dichloroethane, butyl cellosolve, methyl ethyl ketone, toluene, heptane, xylene, ethyl acetate, etc.

If water is employed as the liquid vehicle, it is preferred that a surfactant material also be included in the treatment composition. The surfactant may comprise up to 2.5 times the weight of the aziridine component in the treatment composition. Anionic, cationic, non-ionic, or amphoteric surfactant materials may be employed. Examples of useful surfactants include octylphenoxy polyethoxy ethanol, alkylaryl polyethersulfonates, ethoxylated fluorochemical alcohols, fluoroaliphatic polyesters, etc.

In certain instances it has been found that surfaces treated with a composition comprising water, aziridine and optionally surfactant are textured, i.e., it has clusters of pronounced surface irregularities separated from one another by areas of smooth surface. The clusters, which may be seen as projections from a replicated surface when viewed under 32,000X magnification using a transmission electron micrograph, are not present when an organic solvent is used as the liquid vehicle.

While the treatment composition employed in the present invention consists essentially of the aziridine compound, it is permissible to employ other ingredients such as binders, surfactants, slip agents, colorants (e.g., dyes and pigments), antioxidants, UV light stabilizers and the like. These ingredients are essentially non-reactive with the aziridine under normal conditions, that is they do not react with the aziridine functionality. If reactive ingredients are employed, they must be present in insignificant amounts so that they do not prevent interaction between the substrate surface and the aziridine group.

Within these guidelines, varying amounts of inert other ingredients may be employed. For example, binders may comprise up to 50 percent by weight of the treatment composition. Slip agents, colorants, antioxidants and UV light stabilizers may comprise up to 5 percent by weight of the treatment composition.

The articles of the invention are uniquely suited to being prepared by continuous in-line manufacturing processes. The treatment composition may be applied to either unoriented, partially oriented, or fully oriented webs. Treated unoriented or partially oriented webs may be further oriented if desired. Conventional orientation conditions may be used in such processes. Thus, the web may be stretched in the lengthwise direction by known techniques and subsequently stretched in the crosswise direction using known techniques. Alternatively, biaxially stretched in both directions at the same time.

A particularly useful manufacturing process comprises the steps of stretching the web in the lengthwise direction at 80-95° C., applying the treatment composition to the uniaxially oriented web, stretching the treated, uniaxially oriented web at 100°-120° C. in the crosswise direction, and then heat setting the biaxially oriented web at 200°-250° C. Typically webs are oriented by being stretched to from 1 to 5 times their original dimension wherein the length to width stretch ratio may vary from 1:1 to 1:5 and from 5:1 to 1:1. Other stretch ratios may be used if desired.

After the surface has been treated, a layer of functional material may be applied thereto using known techniques. The phrase "functional material" means any material subsequently applied to the treated surface. These materials include, as noted above, a magnetic recording medium, an adhesive, a radiation sensitive composition, and a silane coating. The functional layer is attached at an interface which has been modified by interaction between the surface and the aziridine-containing compound. The functional layer may be smooth, rough textured, continuous, intermittent the like. Moreover, it may vary in thickness if desired.

The present invention will be further explained by reference to the following examples wherein all percents are percents by weight unless otherwise specified. These examples serve to further illustrate the present invention and do not limit it.

EXAMPLES 1-12

A treatment composition containing "CX-100" available from Polyvinyl Chemical Industries and fluid media (Acetone) was prepared by combining the ingredients in a suitable mixing vessel and stirring them at 20° C. until the mixture was uniform. The treatment composition was then applied to the substrates using Meyer bar coating and dried in an air circulating oven to provide treated layers having various thicknesses.

The inorganic substrates were first scrubbed with a concentrated detergent solution using a camel hair brush, rinsed thoroughly in warm tap water, rinsed with deionized water, then dried overnight at room temperature before being treated.

A functional magnetizable coating was applied over the aziridine-treated surface and dried to provide a dry layer about $3\mu$ thick. The magnetizable coating comprised 66 weight percent acicular iron oxide particles having an average length of 0.6 micrometer and an aspect ratio of about 8:1. The binder comprised polyurethane elastomer, phenoxy resin and other ingredients substantially as described in the comparative example of U.S. Pat. No. 4,210,703.

The functional coating was applied using a Meyer rod and dried in a forced air oven at 71° C. for one minute followed by 82° C. for one minute. The coated substrates were then aged for five days at room temperature and then tested for adhesion using the following scrape adhesion test.

The sample to be tested was fastened to a flat, solid, surface with the functional coating being exposed. A "BIC" disposable razor was placed on the coating such that the blade contacted the coating. While applying a force on the razor normal to the coating in excess of 5 kg. the razor was pushed away from the tester at a rate of 10-20 cm/min. The adhesion of the coating to the substrate was observed and rated as follows:

| RATING | OBSERVATION |
| --- | --- |
| Excellent | 100% retention of coating on modified surface |
| Good | 90-100% retention of coating on modified surface. |
| Fair | 75-90% retention of coating on modified surface. |
| Poor | Less than 75% retention of coating on modified surface. |

The treatment conditions and results are set forth in Table 1.

TABLE 1

| EX. No. | SUBSTRATE | DRY CONDITIONS (TEMP (°C.)/TIME (Min)) | | TREATMENT LAYER THICKNESS ($\mu$) | ADHESION RATING |
| --- | --- | --- | --- | --- | --- |
| | | 1ST STAGE | 2ND STAGE | | |
| 1 | Polyester (biaxially oriented) | 74/1 | 138/2 | 0.304 | Excellent |
| 2 | Polypropylene (oriented) | 74/1 | 127/2 | 0.304 | Excellent |
| 3 | Polyethylene | 74/1 | 93/2 | 0.304 | Fair |
| 4 | Polycarbonate | 74/1 | 121/2 | 0.304 | Excellent |
| 5 | Polyvinyl acetate | 74/1 | 138/2 | 0.608 | Excellent |
| 6 | Polystyrene | 74/1 | 93/2 | 0.608 | Excellent |
| 7 | Polyimide ("Kapton" from DuPont) | 74/1 | 138/2 | 0.304 | Excellent |
| 8 | Polyvinyl chloride | 74/1 | 121/2 | 0.608 | Excellent |
| 9 | Aluminum | 74/1 | 138/2 | 1.216 | Excellent |
| 10 | Copper | 74/1 | 138/2 | 1.216 | Excellent |
| 11 | Plate glass | 74/1 | 138/2 | 1.216 | Excellent |
| 12 | Ceramic tile | 74/1 | 138/2 | 0.304 | Good |

EXAMPLES 13-22

Treatment compositions were prepared using various aziridine-functional compounds and applied to biaxially oriented poly(ethylene terephtalate) film. The aziridine employed and the adhesion results obtained are set out in Table 2.

TABLE 2

| EXAMPLE | AZIRIDINE FORMULA | MODIFIED SURFACE THICKNESS ($\mu$) | ADHESION RATING |
| --- | --- | --- | --- |
| 13 | A | 0.008 | Excellent |
| 14 | A | 0.015 | Excellent |
| 15 | A | 0.031 | Excellent |
| 16 | A | 0.076 | Excellent |
| 17 | A | 0.13 | Excellent |
| 18 | A | 0.25 | Excellent |
| 19 | A | 0.5 | Excellent |
| 20 | A | 1.216 | Excellent |
| 21 | G | 1.368 | Excellent |
| 22 | F | 0.076 | Excellent |

EXAMPLE 23-36

Treatment compositions were prepared using various aziridine-functional compounds and applied to corona treated biaxially oriented poly(ehtylene terepthalate). The aziridine used and the adhesiionn results obtained are set out in Table 3.

TABLE 3

| EXAMPLE | AZIRIDINE FORMULA | MODIFIED SURFACE THICKNESS ($\mu$) | ADHESION RATING |
| --- | --- | --- | --- |
| 23 | A | 2.432 | Excellent |
| 24 | C | 0.038 | Excellent |
| 25 | C | 0.076 | Excellent |
| 26 | C | 0.152 | Excellent |
| 27 | C | 0.500 | Excellent |
| 28 | D1/D2 | 0.038 | Excellent |
| 29 | D1/D2 | 0.076 | Excellent |
| 30 | D1/D2 | 0.152 | Excellent |
| 31 | D1/D2 | 0.500 | Excellent |
| 32 | E | 0.038 | Excellent |
| 33 | E | 0.076 | Excellent |
| 34 | E | 0.152 | Excellent |
| 35 | F | 0.136 | Good |
| 36 | H | 1.368 | Good |

EXAMPLES 37-45

Treatment compositions comprising "CX-100", water and various surfactants were prepared and applied to one surface of a poly(ethylene terephthalate) surface. The treated surfaces were dried in an air circulating oven at 74° C. for 1 minute 138° C. for 2 minutes. the functional oxide coating described in Example 1 was applied to the dried surface as described in Example 1 and tested for adhesion. The results obtained are given in Table 3.

TABLE 4

| EX. | AZIRIDINE % | SURFACTANT % | TYPE | MODIFIED SURFACE THICKNESS ($\mu$) | ADHESION RATING |
| --- | --- | --- | --- | --- | --- |
| 37 | 2.3 | 0.7 | "Triton" X-200[1] | 0.152 | Excellent |
| 38 | 2.3 | 0.7 | "Triton" X-200 | 0.044 | Excellent |
| 39 | 2.3 | 0.7 | "Triton" X-200 | 0.076 | Excellent |
| 40 | 2.7 | 0.3 | "FC-170"[2] | 1.216 | Excellent |
| 41 | 2.3 | 0.7 | "FC-170" | 0.916 | Excellent |
| 42 | 2.7 | 0.3 | "FC-430"[3] | 1.216 | Excellent |
| 43 | 2.3 | 0.7 | "FC-430" | 0.916 | Excellent |
| 44 | 2.3 | 0.7 | "Triton" X-100[4] | 1.216 | Excellent |
| 45 | 2.3 | 0.7 | "Triton" X-100 | 0.916 | Excellent |

[1]Sodium salt of alkaryl polyether sulfonate available from Rohm & Haas.
[2]Fluorochemical surfactant available from Minnesota Mining and Manufacturing Company.
[3]Fluorochemical surfactant available from Minnesota Mining and Manufacturing Company.
[4]Octyl phenoxy polyethoxy ethanol available from Rohm and Haas.

The treated surfaces were replicated and the replications were examined under a transmission electron microscope at 32,000X. It was found that the treated surfaces comprised a discontinues surface having clusters of surface irregularities projecting upward from the surface. Surfaces treated with organic solvent solutions or aziridines did not possess the clusters of projecting sites but comprised relatively smooth surfaces.

EXAMPLE 46

A treatment composition containing aziridine of formula B1/B2 (4% by weight in water) was prepared. An unoriented cast poly(ethylene terephthalate) web was oriented in the length direction at 90° C. by stretching it to 3.5 times its original length. The treatment composition was applied to one surface of the uniaxially oriented web, and the treated web then oriented in the width direction at 110° C. by stretching it to 3.5 times its original width. The biaxially oriented film was then heat set at 230° C. The treated surface provided a layer that was 0.122$\mu$ thick.

A functional oxide coating of the formula described in Example 1 was applied to the treated surface and dried as in Example 1. The functional coating had excellent adhesion to the substrate.

EXAMPLES 47-51

Treatment compositions comprising 8 weight percent "CX-100", 71.4 weight percent water, 1.6 weight percent "Triton" X-100 and 19 weight percent 1N HCl were prepared and applied to one surface of an unoriented poly(ethylene terephthalate) web and dried at 72° C. for three minutes. The treated web was then conditioned for 1.5 minutes at 93° C. and then biaxially oriented by stretching it 3.5×3.5 times at 110° C. The oriented film was then heat set at 230°-245° C.

A gelatin composition comprising the following materials was then applied to the modified surface of the biaxially oriented and heat set film:

| COMPONENT | PARTS BY WEIGHT |
| --- | --- |
| Lana Perl Red Dye | 0.023 |
| Gelatin | 9.9 |
| Water | 92.0 |
| "Triton" X-200 | 0.01 |
| Formaldehyde (37% in water) | 0.08 |
| $H_2SO_4$ | 0.125 |

The gelatin was applied as a warm solution at a coating thickness of about 7582 . The coating was dried for four hours at 20° C. and then tested for adhesion to the modified surface. The dried gelatin layer was scribed using a cross-hatch template and a thin metal tip. A section of No. 610 tape (available from Minnesota Mining and Manufacturing Company) was applied to the scribed area, pressed down and quickly removed. The quantity of gelatin retained on the modified surface was then recorded. The results are given in Table 5.

TABLE 5

| EXAMPLE | MODIFIED SURFACE THICKNESS ($\mu$) | % GELATIN RETAINED |
| --- | --- | --- |
| 47 | 0.182 | 100 |
| 48 | 0.364 | 100 |
| 49 | 0.486 | 100 |
| 50 | 0.364 | 60–80 |
| 51 | 0.046 | 0–20 |

These results show that even at aziridine-modified surface thicknesses of as low as 0.046$\mu$, there is till adhesion of the gelatin to the surface.

What is claimed is:

1. An aritcole having at least one essentially flat major surface which has been treated with a composition consisting of an aziridine-containing compound having the formula

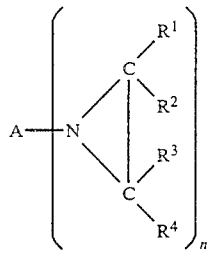

wherein A is an n-valent organic or inorganic group, $R^1$, $R^2$, $R^3$, $R^4$ are independently selected from hydrogen and lower alkyl groups, and n is a whole number of at least 1 so as to render said surface more adherent to subsequently applied layers and further wherein said article is an inorganic material.

2. A sheet according to claim 1 wherein said inorganic material is selected from glass, metal and ceramic.

* * * * *

UNITED STATES PATENT AND TRADEMARK OFFICE
CERTIFICATE OF CORRECTION

PATENT NO. : 5,057,371

DATED : October 15, 1991

INVENTOR(S) : George Canty and Robert E. Jones

It is certified that error appears in the above-identified patent and that said Letters Patent is hereby corrected as shown below:

Col. 9, line 48, "the" should read --The--.

Col. 10, line 49, "7582" should read --75$\mu$--.

Col. 11, line 22, "articole" should read --article--.

Signed and Sealed this

Fifteenth Day of June, 1993

Attest:

MICHAEL K. KIRK

*Attesting Officer*      Acting Commissioner of Patents and Trademarks